(12) United States Patent
Bin Budiman et al.

(10) Patent No.: US 10,991,551 B2
(45) Date of Patent: Apr. 27, 2021

(54) CLEANING METHOD AND PLASMA PROCESSING APPARATUS

(71) Applicant: TOKYO ELECTRON LIMITED, Tokyo (JP)

(72) Inventors: Mohd Fairuz Bin Budiman, Miyagi (JP); Shinya Morikita, Miyagi (JP); Toshifumi Nagaiwa, Hsin-chu (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/844,449

(22) Filed: Apr. 9, 2020

(65) Prior Publication Data
US 2020/0328064 A1 Oct. 15, 2020

(30) Foreign Application Priority Data
Apr. 15, 2019 (JP) .............................. JP2019-077360

(51) Int. Cl.
H01J 37/32 (2006.01)
H05H 1/46 (2006.01)

(52) U.S. Cl.
CPC .... *H01J 37/32091* (2013.01); *H01J 37/3244* (2013.01); *H01J 37/32568* (2013.01); *H01J 37/32715* (2013.01); *H01J 37/32889* (2013.01); *H05H 1/46* (2013.01); *H01J 2237/032* (2013.01); *H01J 2237/24564* (2013.01); *H01J 2237/335* (2013.01)

(58) Field of Classification Search
None
See application file for complete search history.

(56) References Cited

U.S. PATENT DOCUMENTS

2009/0114244 A1* 5/2009 Sexton .............. H01J 37/32174
134/1.1
2018/0061692 A1* 3/2018 Nishino ............ H01L 21/67745

FOREIGN PATENT DOCUMENTS

JP 2005-243915 A 9/2005

* cited by examiner

*Primary Examiner* — Dedei K Hammond
(74) *Attorney, Agent, or Firm* — Rothwell, Figg, Ernst & Manbeck, P.C.

(57) ABSTRACT

A cleaning method is provided. In the cleaning method, a cleaning gas is supplied into a processing chamber, a radio frequency (RF) power for plasma generation is applied to one of a first electrode on which a substrate is to be mounted and a second electrode disposed to be opposite to the first electrode in the processing chamber, and a negative voltage is applied to an edge ring disposed to surround the substrate. Further, plasma is generated from the cleaning gas and a cleaning process using the plasma is performed.

17 Claims, 5 Drawing Sheets

CLEANING METHOD AND PLASMA PROCESSING APPARATUS

CROSS-REFERENCE TO RELATED APPLICATIONS

This application claims priority to Japanese Patent Application No. 2019-077360, filed on Apr. 15, 2019, the entire contents of which are incorporated herein by reference.

TECHNICAL FIELD

The present disclosure relates to a cleaning method and a plasma processing apparatus.

BACKGROUND

Conventionally, there is suggested a technique for supplying a large amount of gas into a processing chamber so that shock waves can be generated due to an increase in pressure, peeling off particles adhered to the inside of the processing chamber using the shock waves, and removing the peeled-off particles using the viscosity of the gas (see, e.g., Japanese Patent Application Publication No. 2005-243915).

However, in the above-described technique, the particles in the processing chamber may not be completely removed. For example, the particles may remain on an edge ring disposed to surround a semiconductor wafer (hereinafter, referred to as "wafer") on a mounting table and a vicinity thereof. In that case, the particles are adsorbed to the outermost peripheral portion of the wafer mounted on the mounting table and affect the processing of the wafer, which results in a low yield and poor productivity. If particles are generated from components other than the components disposed at the vicinity of the mounting table in the processing chamber, the processing of the wafer is also affected.

The present disclosure provides a technique capable of efficiently removing particles.

SUMMARY

In accordance with an aspect of the present disclosure, there is provided a cleaning method comprising: (a) supplying a cleaning gas into a processing chamber; (b) applying a radio frequency (RF) power for plasma generation to one of a first electrode on which a substrate is to be mounted and a second electrode disposed to be opposite to the first electrode in the processing chamber; (c) applying a negative voltage to an edge ring disposed to surround the substrate; and (d) generating plasma from the cleaning gas and performing a cleaning process using the plasma.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings. Like reference numerals will be given to like or corresponding parts throughout the drawings and redundant description thereof will be omitted.

(Plasma Processing Apparatus)

Figure 1:
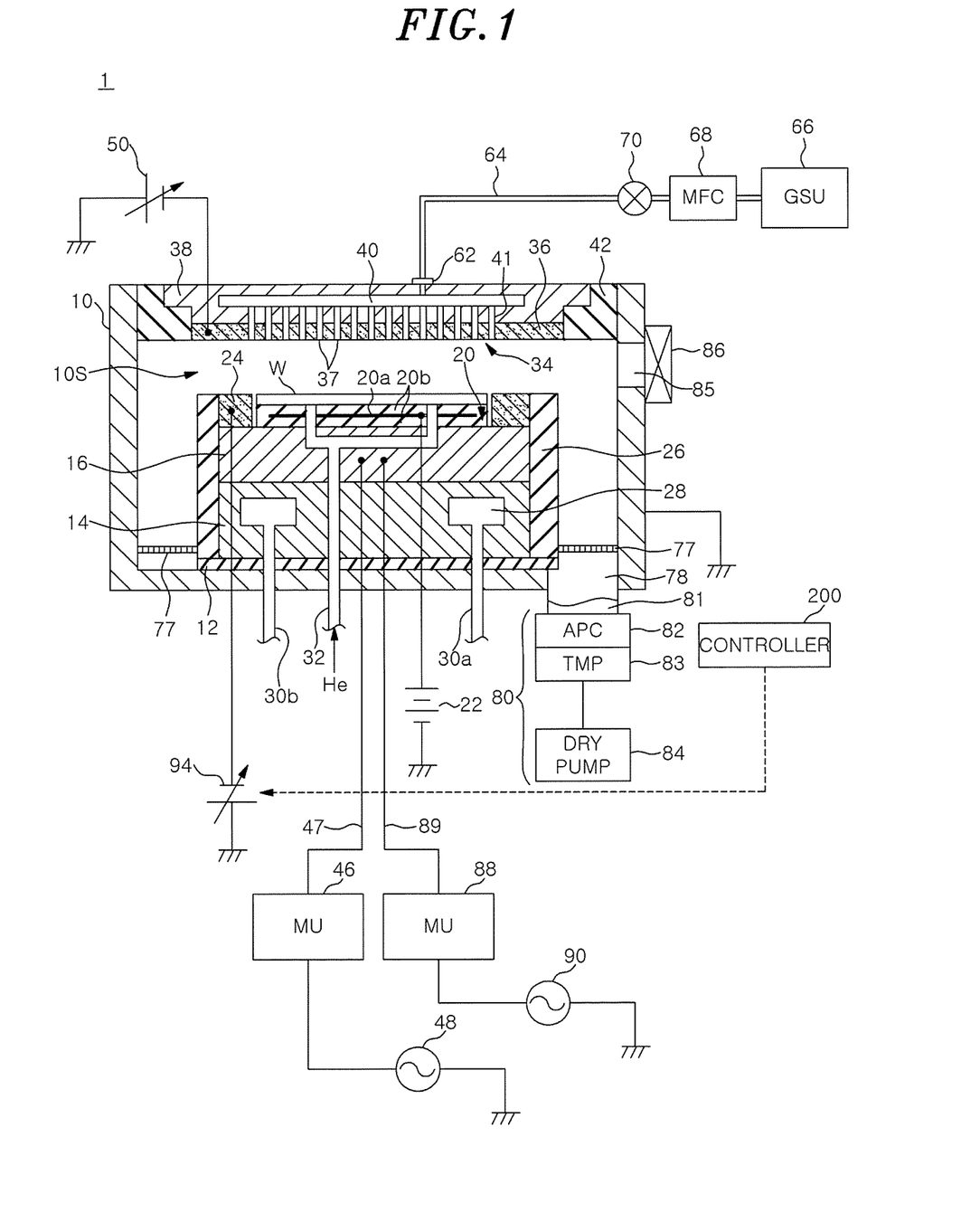
FIG. 1 is a schematic cross-sectional view showing an example of a plasma processing apparatus according to an embodiment.

A plasma processing apparatus 1 according to an embodiment will be described with reference to FIG. 1. FIG. 1 is a schematic cross-sectional view showing an example of a plasma processing apparatus 1 according to an embodiment.

The plasma processing apparatus 1 of the present embodiment is a capacitively coupled parallel plate type plasma processing apparatus. The plasma processing apparatus 1 includes a cylindrical processing chamber 10 made of, e.g., aluminum having an anodically oxidized surface. The processing chamber 10 is frame-grounded.

A support 14 is disposed at a bottom portion of the processing chamber 10 with an insulating plate 12 made of ceramic or the like disposed between the support 14 and the processing chamber 10. A mounting table 16 is disposed on the support 14. The support 14 and the mounting table 16 are made of, e.g., aluminum.

An electrostatic chuck 20 for attracting and holding a wafer W, which is an example of a substrate, using an electrostatic force is disposed on a top surface of the mounting table 16. The electrostatic chuck 20 has a structure in which an electrode 20a made of a conductive film is embedded between two insulating layers 20b or two insulating sheets. The wafer W is mounted on the electrostatic chuck 20 W. A power supply 22 is connected to the electrode 20a. The wafer W is attracted and held on the electrostatic chuck 20 by the electrostatic force such as a Coulomb force generated by a DC voltage supplied from the power supply 22.

A conductive edge ring 24 made of, e.g., silicon surrounds the wafer W to improve the uniformity of plasma processing. A cylindrical cover ring 26 made of, e.g., quartz, surrounds the edge ring 24 and extends to the side surfaces of the mounting table 16 and the support 14.

A coolant chamber 28 having, e.g., an annular shape, is disposed in the support 14. A heat exchange medium of a predetermined temperature, e.g., a coolant, is supplied from an external chiller unit and circulated in the coolant chamber 28 through lines 30a and 30b. Accordingly, the temperature of the wafer W mounted on the mounting table is controlled by the temperature of the heat exchange medium. A heat transfer gas, e.g., He gas, is supplied from a heat transfer gas supply unit to a gap between the top surface of the electrostatic chuck 20 and the backside of the wafer W through a gas supply line 32. Accordingly, the heat can be efficiently transferred between the mounting table 16 and the wafer W, and the controllability of the temperature of the wafer W can be improved.

The plasma processing apparatus 1 includes a first radio frequency (RF) power supply 48 and a second RF power supply 90. The first RF power supply 48 generates a first RF power (hereinafter, also referred to as "HF power") that has a frequency suitable for plasma generation. The first RF power has a frequency within a range of, e.g., 27 MHz to 100 MHz. The first RF power supply 48 is connected to the mounting table 16 (lower electrode) through a matching unit (MU) 46 and a power feed rod 47. The matching unit 46 has a circuit for matching an output impedance of the first RF power supply 48 and an impedance of a load side (the lower electrode side). The first RF power supply 48 may be connected to a shower head (upper electrode) 34 through the matching unit 46. The first RF power supply 48 constitutes an example of a plasma generation unit.

The second RF power supply 90 generates a second RF power (hereinafter, also referred to as "LF power") that has a frequency lower than that of the first RF power. In the case of using the second RF power as well as the first RF power, the second RF power is used as an RF power for a bias voltage for attracting ions into the substrate W. The second RF power has a frequency within a range of, e.g., 400 kHz to 13.56 MHz. The second RF power supply 90 is connected to the mounting table 16 (lower electrode) through a matching unit (MU) 88 and a power feed rod 89. The matching unit 88 has a circuit for matching an output impedance of the second RF power supply 90 and the impedance of the load side (the lower electrode side).

The plasma may be generated using the second RF power without using the first RF power. In other words, the plasma may be generated using only a single RF power. In this case, the frequency of the second RF power may be higher than 13.56 MHz. For example, the frequency of the second RF power may be 40 MHz. The plasma processing apparatus 1 may not include the first RF power supply 48 and the matching unit 46. In this case, the second RF power supply 90 constitutes an example of the plasma generation unit. Further, the mounting table 16 may not have the electrostatic chuck 20.

The shower head 34 is disposed above the mounting table 16 to be opposite to the mounting table 16. A space between the shower head 34 and the mounting table 16 serves as a plasma generation space 10S where plasma is generated. The shower head 34 serves as the upper electrode with respect to the mounting table 16 that serves as the lower electrode.

The shower head 34 is supported at an upper portion of the processing chamber 10 through an insulating shielding member 42. The shower head 34 includes an electrode plate 36 having a plurality of gas holes 37 and an electrode holder 38 for detachably holding the electrode plate 36. The electrode holder 38 is made of a conductive material, e.g., aluminum having an anodically oxidized surface. The electrode plate 36 is made of silicon or SiC. A gas diffusion space 40 is formed in the electrode holder 38. A plurality of gas lines 41 extends downward from the gas diffusion space 40 and communicates with the gas holes 37 at the tip ends thereof.

A gas inlet port 62 for introducing a gas to the gas diffusion space 40 is disposed at the electrode holder 38. A gas supply line 64 is connected to the gas inlet port 62. A gas supply unit (GSU) 66, a mass flow controller (MFC) 68, and an opening/closing valve 70 are connected to the gas supply line 64 in that order from the upstream side of the gas supply line 64. The gas is supplied from the gas supply unit 66, and a flow rate and supply timing thereof are controlled by the mass flow controller 68 and the opening/closing valve 70. The gas from the gas supply line 64 reaches the gas diffusion space 40 through the gas inlet port 62. Then, the gas passes through the gas lines 41 and is injected into the plasma generation space 10S in a shower-like manner from the gas holes 37.

The plasma processing apparatus 1 further includes a power supply 50 and a power supply 94. The power supply 50 is connected to the shower head 34. The power supply 50 applies a voltage to the shower head 34 to attract positive ions in the plasma generated in the plasma generation space 10S into the electrode plate 36. The power supply 94 is connected to the mounting table 16. The power supply 94 applies a voltage to the mounting table 16 to attract positive ions in the plasma generated in the plasma generation space 10S into the mounting table 16. The power supplies 50 and 94 may be bipolar power supplies.

A gas exhaust port 78 is formed at the bottom portion of the processing chamber 10 and is connected to a gas exhaust unit 80 through a gas exhaust line 81. In a gas exhaust passage connected to the gas exhaust port 78, a gas exhaust plate 77 is disposed to capture or reflect the plasma generated in the plasma generation space 10S to prevent the plasma from leaking into the gas exhaust unit 80. The gas exhaust plate 77 may be formed by coating an aluminum base with ceramic such as yttria ($Y_2O_3$) or the like.

The gas exhaust unit 80 includes an adaptive pressure control (APC) valve 82, a turbo molecular pump (TMP) 83, and a dry pump 84.

The TMP 83 and the dry pump 84 are connected to the gas exhaust line 81 through the APC valve 82. After the processing chamber 10 is roughly evacuated by the dry pump 84, the processing chamber 10 is vacuum-evacuated by the TMP 83. At this time, the pressure is controlled by adjusting the opening degree of the APC valve 82.

A loading/unloading port 85 for the wafer W is disposed at a sidewall of the processing chamber 10. The loading/unloading port 85 can be opened and closed by a gate valve 86. In the processing apparatus configured as described above, in order to perform plasma processing such as etching or the like, the gate valve 86 is opened first. Then, the wafer W held by a transfer arm is loaded into the processing chamber 10 through the loading/unloading port 85. The wafer W is transferred from the transfer arm onto lifter pins and is mounted on the mounting table 16.

A processing gas supplied from the gas supply unit 66 passes through the gas lines 41 and is injected into the processing chamber 10 in a shower-like manner through the gas holes 37. The processing chamber 10 is exhausted by the gas exhaust unit 80.

The plasma processing apparatus 1 further includes a controller 200 for controlling the entire operation of the plasma processing apparatus 1. The controller 200 may be a computer including a processor, a storage unit such as a memory, an input device, a display device, a signal I/O interface, and the like. The controller 200 controls respective components of the plasma processing apparatus 1. In the controller 200, an operator can input a command to manage the plasma processing apparatus 1 through the input device. In the controller 200, the operation status of the plasma processing apparatus 1 can be visualized on the display device. Further, a process control program, a cleaning control program, and recipe data are stored in the storage unit.

The processor executes the process control program to perform a predetermined plasma processing on the wafer W. Further, the controller 200 executes the cleaning control program to clean the edge ring 24, the outer periphery of the wafer W located at a vicinity of the edge ring, and the cover ring 26.

(Cleaning Process)

Figure 2:
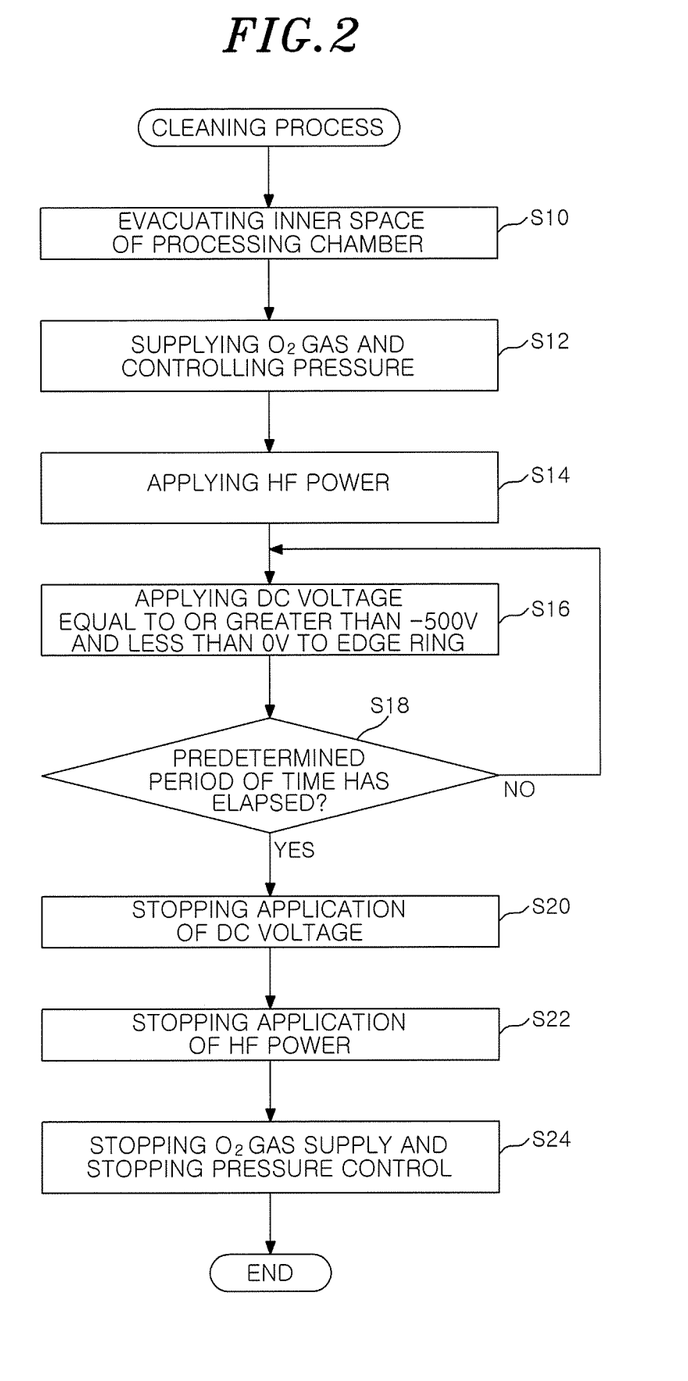
FIG. 2 is a flowchart showing an example of a cleaning method according to the embodiment.

Next, an example of a cleaning process performed by the plasma processing apparatus 1 according to the present embodiment will be described with reference to FIGS. 2, 3A and 3B. FIG. 2 is a flowchart showing an example of the cleaning process according to the present embodiment.

Figure 3A:
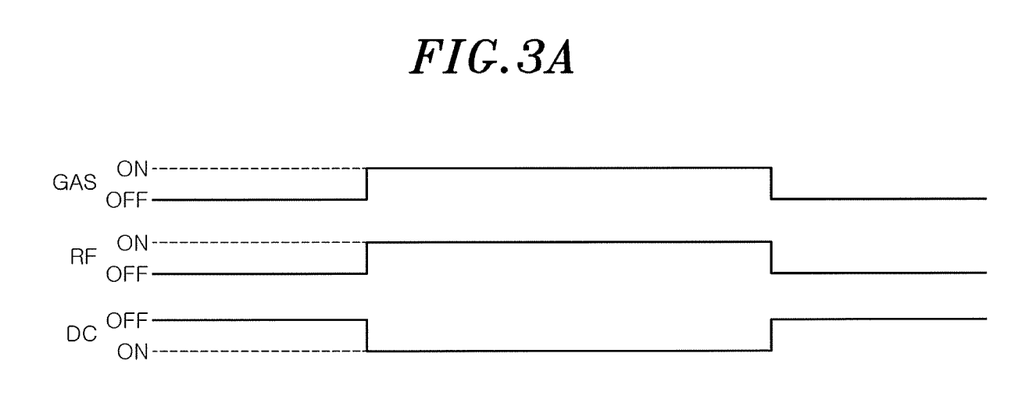
FIGS. 3A and 3B are time charts showing an example of the cleaning method according to the embodiment.
Figure 3B:
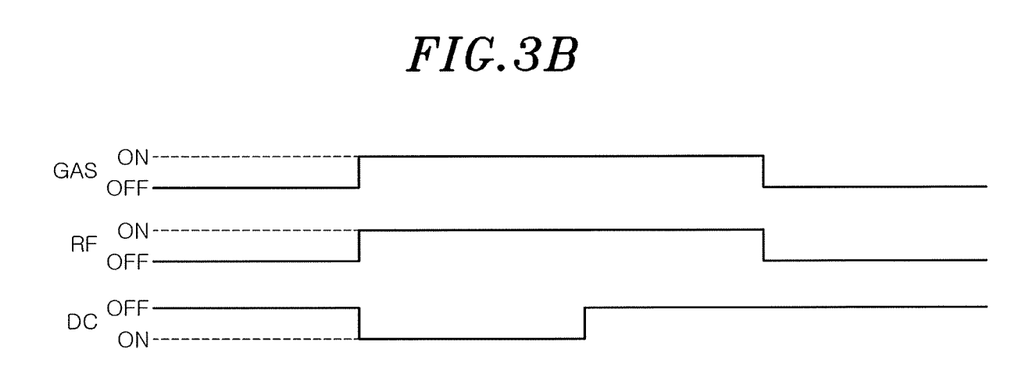

FIGS. 3A and 3B are time charts showing an example of the cleaning process according to the present embodiment. The method of the cleaning process of the present embodiment is controlled by the controller 200.

The cleaning process is performed during the processing of the wafer W in the plasma processing apparatus 1. The timing of performing the cleaning process is not particularly limited. For example, the cleaning process may be performed whenever one wafer W is processed or after a predetermined number of wafers W are processed. The cleaning process may be performed regularly or irregularly. The cleaning process may be performed immediately before the start of the processing for the lot storing 25 wafers W, immediately after the end of the processing of the lot, or during an idle period between the processing of the lots. The wafer W is unloaded before the start of the cleaning process and the following cleaning process is started in a state where no wafer W is mounted on the electrostatic chuck 20.

When the cleaning process is started, the controller 200 controls the gas exhaust unit 80 to vacuum-evacuate an inner space of the processing chamber 10 to a predetermined pressure (step S10). Next, the controller 200 controls the gas supply unit 66 to supply $O_2$ gas to control a pressure in the processing chamber 10 (step S12). The $O_2$ gas is an example of a cleaning gas. The cleaning gas is not limited to the $O_2$ gas as long as it contains oxygen (O). For example, the cleaning gas may be ozone gas.

Next, the controller 200 controls the first RF power supply 48 to apply the HF power to the mounting table 16 (step S14). Next, the controller 200 controls the power supply 94 to apply a DC voltage that is equal to or greater than −500 V and less than 0 V to the edge ring 24 (step S16).

Next, the controller 200 determines whether or not a predetermined period of time has elapsed (step S18). The step S16 is executed until the predetermined period of time elapses. The processing proceeds to step S20 after the predetermined period of time has elapsed.

Next, the controller 200 stops the application of the DC voltage from the power supply 94 (step S20). Then, the controller 200 stops the application of the HF power (step S22). Further, the controller 200 stops the gas exhaust operation and the pressure control operation of the gas exhaust unit 80 and also stops the $O_2$ gas supply (step S24). Then, the cleaning process is terminated.

In accordance with the cleaning process of the present embodiment, the $O_2$ gas supply (Gas ON), the HF power application (RF ON), and the DC voltage application (DC ON) are performed substantially at the same time as shown in FIG. 3A. Further, the $O_2$ gas supply stop (Gas OFF), the HF power application stop (RF OFF), and the DC voltage application stop (DC OFF) are also performed substantially at the same time. However, the HF power application may be performed before the DC voltage application and the HF power application may be stopped after the DC voltage application is stopped.

In the cleaning process of the present embodiment, the $O_2$ gas is turned into plasma by the HF power, and a negative DC voltage is applied to the edge ring 24 in a state where and the $O_2$ plasma is generated in the plasma generation space 10S. Therefore, as shown in FIG. 4, positive ions in the plasma are attracted to the edge ring 24 to which the negative DC voltage is applied, the outer periphery of the wafer W, and the cover ring 26.

Accordingly, reaction products adhered to the edge ring 24, the outer periphery of the wafer W, and the cover ring 26 are peeled off by physical collision of the ions. The peeled-off reaction products are exhausted and removed to the outside of the processing chamber 10 by the gas exhaust unit 80.

Figure 4:
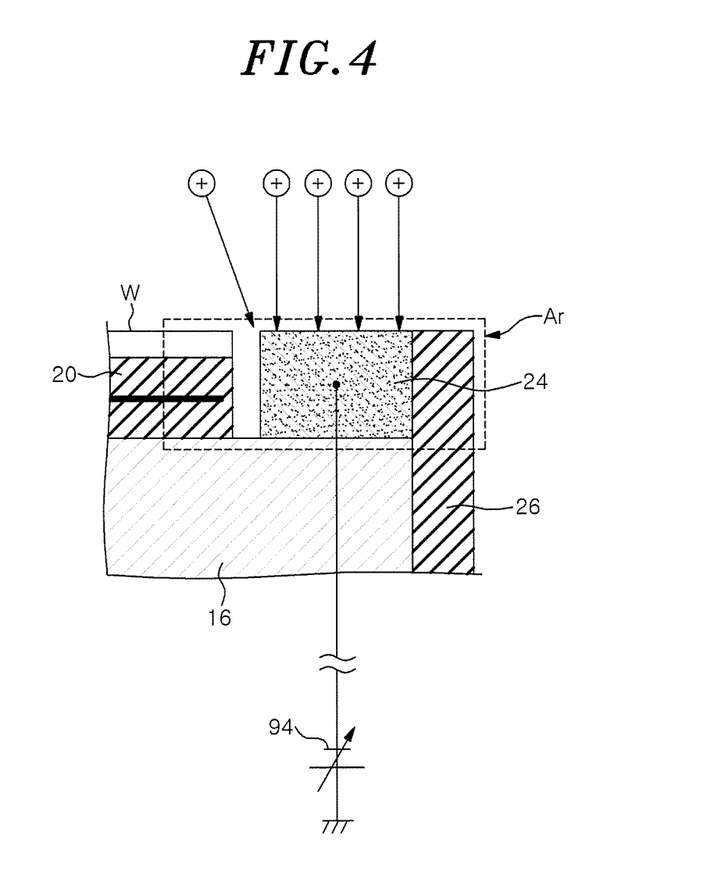
FIG. 4 explains cleaning effects according to the embodiment.

By applying the negative DC voltage to the edge ring 24 in a state where the plasma is generated, it is possible to efficiently remove the particles adhered to cleaning targets such as the outer periphery of the wafer W, the edge ring 24, and the cover ring 26 in an area "AR" indicated in FIG. 4.

Alternatively, the cleaning process may be performed in a state where the $O_2$ gas supply and the HF power application are started without DC voltage application (DC OFF) and the DC voltage application may be started later during the cleaning process. As a result, a chemical cleaning is mainly performed by radicals in the $O_2$ plasma during a period in which no DC voltage is applied. After the DC voltage is applied, a physical cleaning is performed by ions in the $O_2$ plasma. With the cleaning process described above, it is also possible to efficiently remove the particles adhered to the cleaning targets and improve the cleaning effects. The above-described ON and OFF timing of the DC voltage application may be reversed as shown in FIG. 3B. In this case as well, the physical cleaning is mainly performed by the ions in the $O_2$ plasma during a period in which the DC voltage is applied and the chemical cleaning is mainly performed by the radicals in the $O_2$ plasma during a period in which no DC voltage is applied. Accordingly, the cleaning effects can be improved.

Further, in the cleaning process of the present embodiment, the waferless dry cleaning (WLDC) that is executed in a state where no wafer W is mounted on the mounting table 16 is performed. In this case, since no wafer W is mounted on the mounting table 16, the surface of the electrostatic chuck 20 is exposed to the plasma. Therefore, the negative voltage applied from the power supply 94 is preferably equal to or greater than −500 V and less than 0 V so that the electrostatic chuck 20 can be prevented from being damaged by the plasma.

Alternatively, the cleaning process of the present embodiment may be performed in a state where a dummy wafer or the like is mounted on the mounting table 16. In this case, since the surface of the electrostatic chuck 20 is not exposed to the plasma, it is difficult to damage the electrostatic chuck 20 during the cleaning process. Therefore, in this case, a negative voltage of −500 V or less may be applied from the power supply 94.

Technical Effect

Figure 5A:
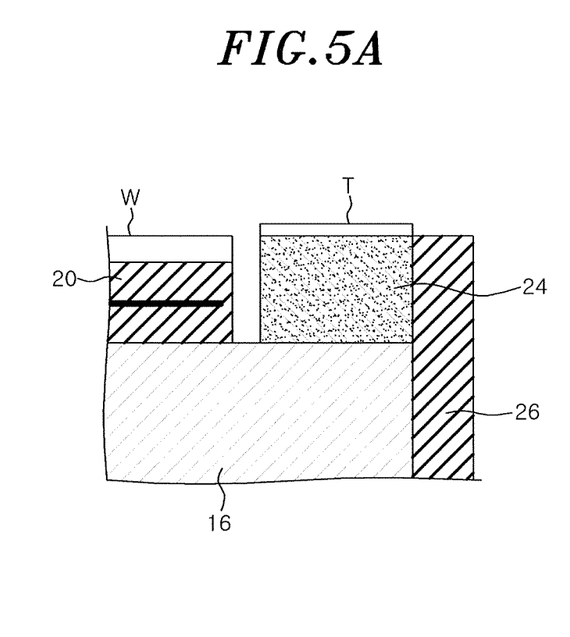
FIGS. 5A and 5B show results of a simulation on the cleaning effects according to the embodiment.
Figure 5B:
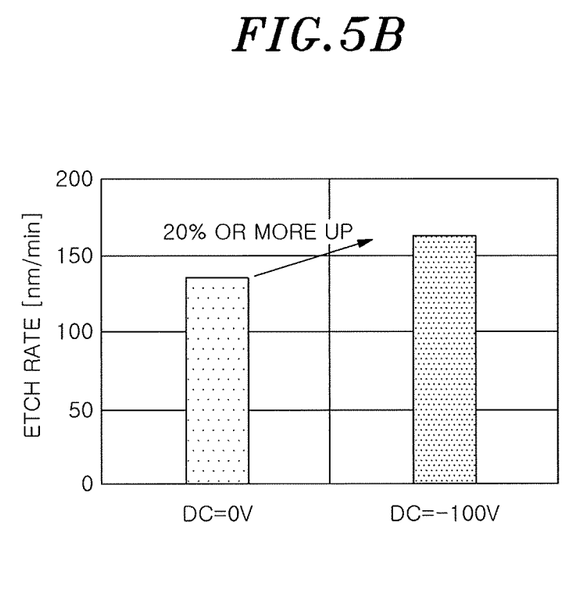

Hereinafter, exemplary technical effects of the cleaning process according to the present embodiment will be described with reference to FIGS. 5A and 5B. FIGS. 5A and 5B show results of a simulation on the effects of the cleaning process according to the embodiment. In this simulation, etching was performed in a state where an organic film T was formed on the edge ring 24 as shown in FIG. 5A. Then, the etching rate of the organic film T was measured to simulate the effects of the cleaning of reaction products on the edge ring 24. The processing conditions at this time were set as follows.

(Processing Conditions)
Gas type: $O_2$ gas
HF power: ON
LF power: OFF

FIG. 5B shows the etching rates obtained by etching the organic film T under the above-described processing conditions. The etching rate shown on the right side of FIG. 5B that was obtained when a DC voltage (DC=−100 V) was applied to the edge ring 24 was higher by 20% or more than the etching rate shown on the left side of FIG. 5B that was obtained when no DC voltage (DC=0 V) was applied to the edge ring 24.

From the above, it was found that, by applying a negative DC voltage to the edge ring 24 in a state where the plasma is generated, the cleaning effects of the edge ring and its vicinity can be effectively enhanced by attracting ions to the edge ring 24.

In the cleaning process (cleaning method) of the present embodiment, the ions are attracted to the edge ring 24 by applying the negative DC voltage to the edge ring 24 in a state where the plasma of the gas is generated by applying the HF power. Accordingly, the edge ring 24 and its vicinity are cleaned.

However, the present disclosure is not limited thereto, and the cleaning process of the edge ring 24 and its vicinity may be performed by applying the LF power or the RF power having a frequency that is substantially equal to that of the LF power to the edge ring 24 in a state where the plasma of the gas is generated by applying the HF power. Alternatively, the cleaning process of the edge ring 24 and its vicinity may be performed by applying the LF power or the RF power having a frequency that is substantially equal to that of the LF power to the edge ring 24 and applying a DC voltage to the edge ring 24 in a state where the plasma of the gas is generated by applying the HF power.

In addition, the cleaning process may be performed by applying a positive DC voltage to negatively charged particles.

Further, in the cleaning process (cleaning method) of the present embodiment, the HF power is used as the RF power for plasma generation. However, the LF power or a microwave power may be used as the RF power for plasma generation.

The cleaning method and the plasma processing apparatus according to the embodiments of the present disclosure are considered to be illustrative in all respects and not restrictive. The above-described embodiments can be embodied in various forms. Further, the above-described embodiments may be omitted, remounted, or changed in various forms without departing from the scope of the appended claims and the gist thereof. The above-described embodiments may include other configurations without contradicting each other and may be combined without contradicting each other.

The plasma processing apparatus of the present disclosure can be applied to any processing apparatus using atomic layer deposition (ALD), capacitively coupled plasma (CCP), inductively coupled plasma (ICP), a radial line slot antenna (RLSA), electron cyclotron resonance (ECR) plasma, helicon wave plasma (HWP), or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A cleaning method comprising:
   (a) supplying a cleaning gas into a processing chamber;
   (b) applying a radio frequency (RF) power for plasma generation to one of a first electrode on which a substrate is to be mounted and a second electrode disposed to be opposite to the first electrode in the processing chamber;
   (c) applying a negative voltage to an edge ring disposed to surround the substrate; and
   (d) generating plasma from the cleaning gas and performing a cleaning process using the plasma.

2. The cleaning method of claim 1, wherein in (d), no substrate is mounted on the first electrode.

3. The cleaning method of claim 2, wherein in (c), the applied negative voltage is equal to or greater than −500 V and less than 0 V.

4. The cleaning method of claim 1, wherein in (d), the edge ring, an outer periphery of the substrate disposed at a vicinity of the edge ring, and a cover ring disposed to surround the edge ring are cleaned.

5. The cleaning method of claim 1, wherein the cleaning gas is an oxygen containing gas.

6. The cleaning method of claim 1, further comprising:
   (e) determining whether or not a predetermined period of time has elapsed after (d) is started; and
   (f) stopping, when it is determined in (e) that the predetermined period of time has elapsed, the supply of the cleaning gas, the application of the RF power and the application of the negative voltage.

7. The cleaning method of claim 1, wherein (b), (c) and (d) are performed simultaneously.

8. The cleaning method of claim 1, wherein (c) is performed after (b).

9. The cleaning method of claim 6, wherein in (f), the supply of the cleaning gas, the application of the RF power and the application of the negative voltage are stopped simultaneously.

10. The cleaning method of claim 6, wherein in (f), the application of the RF power is stopped after the application of the negative voltage is stopped.

11. The cleaning method of claim 1, wherein (d) is performed in a state where a dummy wafer is mounted on the first electrode.

12. The cleaning method of claim 11, wherein in (c), a voltage of −500V or less is applied.

13. The cleaning method of claim 1, wherein in (c), a negative DC voltage is applied.

14. The cleaning method of claim 13, wherein (c), an additional RF power that has a frequency lower than that of the RF power or an RF power having a frequency that is substantially equal to a frequency of the additional RF power is applied to the edge ring together with the negative DC voltage.

15. The cleaning method of claim 1, wherein the RF power for plasma generation is generated from an RF power supply and the negative voltage is generated from an additional power supply connected to the edge ring.

16. A plasma processing apparatus comprising:
   a processing chamber;
   a first electrode on which a substrate is to be mounted in the processing chamber;
   a second electrode disposed to be opposite to the first electrode;
   an edge ring disposed to surround the substrate; and
   a controller configured to cause
   (a) supplying a cleaning gas into the processing chamber;
   (b) applying a radio frequency (RF) power for plasma generation to one of the first electrode and the second electrode;
   (c) applying a negative voltage to the edge ring, and (d) generating plasma from the cleaning gas and performing a cleaning process using the plasma.

17. The plasma processing apparatus of claim 16, wherein the RF power for plasma generation is generated from an RF power supply and the negative voltage is generated from an additional power supply connected to the edge ring.

* * * * *